(12) United States Patent
Dale

(10) Patent No.: US 11,054,456 B2
(45) Date of Patent: Jul. 6, 2021

(54) SYSTEMS AND METHOD FOR DETERMINING LOAD BALANCE ON A THREE-PHASE POWER DISTRIBUTION SYSTEM

(71) Applicant: Sensus Spectrum LLC, Raleigh, NC (US)

(72) Inventor: Robert Dale, Yanceyville, NC (US)

(73) Assignee: Sensus Spectrum LLC, Raleigh, NC (US)

( * ) Notice: Subject to any disclaimer, the term of this patent is extended or adjusted under 35 U.S.C. 154(b) by 696 days.

(21) Appl. No.: 15/707,297

(22) Filed: Sep. 18, 2017

(65) Prior Publication Data

US 2019/0086461 A1   Mar. 21, 2019

(51) Int. Cl.
*G01R 29/18* (2006.01)
*G01R 22/10* (2006.01)
(Continued)

(52) U.S. Cl.
CPC .............. *G01R 29/18* (2013.01); *G01D 4/004* (2013.01); *G01R 19/2513* (2013.01);
(Continued)

(58) Field of Classification Search
CPC .... G01R 29/18; G01R 22/10; G01R 19/2513; G01R 21/133; G01R 25/00; H02J 3/00;
(Continued)

(56) References Cited

U.S. PATENT DOCUMENTS 7,584,066 B2 * 9/2009 Roytelman ............... H02J 3/00
                                                          702/182

8,570,023 B2    10/2013  Uram et al.
(Continued)

FOREIGN PATENT DOCUMENTS

CA     WO 2018/223228     *  6/2018
WO        2010027421 A2      3/2010

OTHER PUBLICATIONS

Xianda Deng, Exploring Six-Phase Transmission Lines for Increasing Power Transfer With limited Right Of Way, 2012.*
International Search Report and Written Opinion for corresponding International Patent Application No. PCT/US2018/032297 dated Aug. 7, 2018.

*Primary Examiner* — Alexander Satanovsky
*Assistant Examiner* — Lynda Dinh
(74) *Attorney, Agent, or Firm* — Andrus Intellectual Property Law, LLP

(57) ABSTRACT

System and methods for determining loading on supply lines of a three-phase power distribution system. Load meters are connected to the supply lines to receive power. A feeder meter is connected to a supply line designated the reference supply line having a known reference phase. A device generates a timing pulse received by the load meters and the feeder meter. The load meters and feeder meter each determine a respective time delay and feeder meter delay from receiving the timing pulse until a landmark value of the power received. The feeder meter delay corresponds to the reference phase. Each load meter and feeder meter includes a transmission device to transmit the time delay or feeder meter delay. An end server receives the time delays and feeder meter delay and assigns each load meter to a phase by comparing the time delay for a load meter to the feeder meter delay.

19 Claims, 9 Drawing Sheets

(51) Int. Cl.
*G06Q 50/06* (2012.01)
*H02J 3/00* (2006.01)
*G01R 25/00* (2006.01)
*G01D 4/00* (2006.01)
*H02J 13/00* (2006.01)
*G01R 21/133* (2006.01)
*G01R 19/25* (2006.01)

(52) U.S. Cl.
CPC ............ *G01R 21/133* (2013.01); *G01R 22/10* (2013.01); *G01R 25/00* (2013.01); *G06Q 50/06* (2013.01); *H02J 3/00* (2013.01); *H02J 13/0062* (2013.01); *H02J 13/0075* (2013.01); *H02J 2203/20* (2020.01)

(58) Field of Classification Search
CPC .... H02J 13/00; H02J 13/0062; H02J 13/0075; H02J 2203/20; G06Q 50/06; G01D 4/004
See application file for complete search history.

(56) References Cited

U.S. PATENT DOCUMENTS

| | | |
|---|---|---|
| 2003/0184275 A1 | 10/2003 | Slade et al. |
| 2009/0150099 A1* | 6/2009 | Balcerek ............... G01R 31/086 |
| | | 702/59 |
| 2010/0134089 A1* | 6/2010 | Uram .................... G01R 22/063 |
| | | 324/66 |
| 2011/0301894 A1 | 12/2011 | Sanderford, Jr. |
| 2012/0041696 A1 | 2/2012 | Sanderford, Jr. et al. |
| 2013/0024149 A1 | 1/2013 | Nayar et al. |
| 2016/0109497 A1* | 4/2016 | Aiello .................... G01R 11/40 |
| | | 324/76.77 |
| 2016/0154040 A1 | 6/2016 | Driscoll et al. |
| 2018/0375332 A1* | 12/2018 | Fan ......................... H02J 3/382 |

* cited by examiner

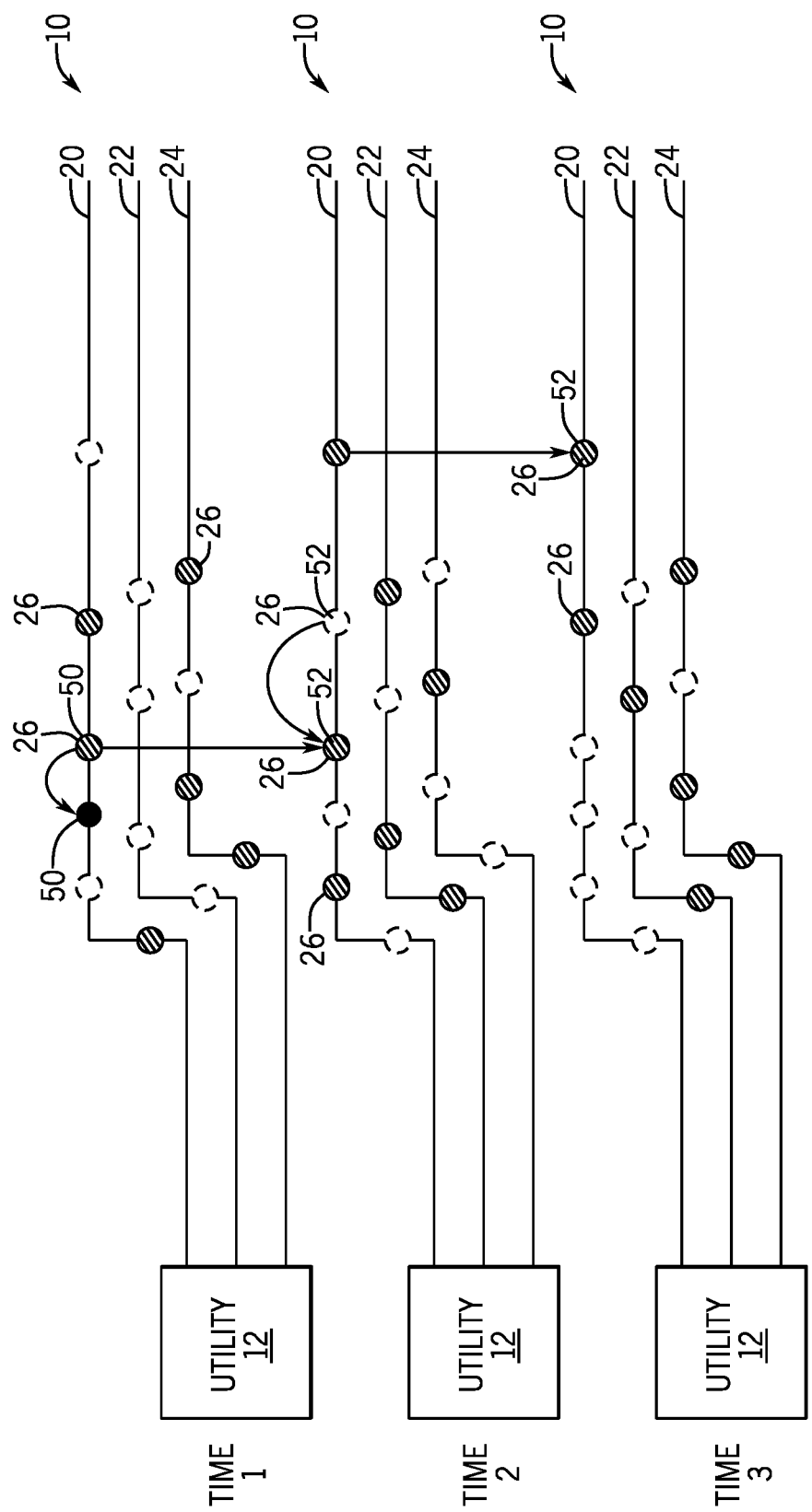

SYSTEMS AND METHOD FOR DETERMINING LOAD BALANCE ON A THREE-PHASE POWER DISTRIBUTION SYSTEM

FIELD

The present disclosure generally relates to systems and methods for determining the load balance on a three-phase power distribution system, and more particularly to determining the load balance using fewer reference meters than the number of supply lines within range of a tower.

BACKGROUND

The Background and Summary are provided to introduce a foundation and selection of concepts that are further described below in the Detailed Description. The Background and Summary are not intended to identify key or essential features of the claimed subject matter, nor are they intended to be used as an aid in limiting the scope of the claimed subject matter.

The following U.S. Patents and Patent Applications are incorporated herein by reference:

U.S. Pat. No. 8,570,023 discloses a system and method for determining the relative phase of each of a plurality of load meters connected to a three-phase power distribution system. The system includes a gateway that communicates information to and from each of the individual load meters. The gateway generates a timing pulse that is received by each of the load meters. Based upon the delay from the receipt of the timing pulse to the next zero crossing of the single phase power supply received by the meter, the utility can determine the phase of the individual meter. The system can include a feeder meter connected to each phase of the electrical supply system to determine the energy consumption for each of the meters connected to a specific phase. The utility can compare the energy consumption information from the feeder meter to all of the load meters connected to the same phase to determine whether any energy theft is occurring.

U.S. Patent Application Publication No. 2012/0041696 discloses a standard electric utility meter with a meter having a signal sensor, signal generator, and processor platform to stimulate broad software and firmware development innovation. The utility can then select the 'application' that best suits their analysis needs. The meter platform consists of 3 layers: physical interfaces, pre-processing resources, and applications processing & database. The physical interfaces include voltage, current, and load sensors, radio and PLC communications, optical, and power control for advanced outage management. The increased processing capabilities combined with signal and data processing allow for true distributed intelligence in the smart grid. The physical layer, pre-processing DSP and firmware form open APIs for third party developers.

U.S. Patent Application Publication No. 2011/0301894 discloses a system and method for use in a non-intrusive load monitoring system to identify specific types of loads and communicate the identified load information to interested parties. The non-intrusive load monitoring system includes an electricity meter that measures load information from a home or facility. The load information is analyzed by comparing the information to a series of load signatures for various known electrical loads to identify the specific type of electric load. Once the type of load is identified, the system utilizes the information to analyze the operation of the load and relay messages to the home owner regarding such operation. The load information may be used by a utility to better predict and manage peak and average electricity consumption over the year. Upon customer authorization, the load identification information may also be relayed to third parties for use in directed sales campaigns and discount promotions.

Electrical utilities provide three-phase power across utility lines. Transformers are located at various locations near residential and commercial sites that provide a point of connection for each of the commercial and residential sites, which are referred to as loads. Each of the loads can be connected to one of the three phases of electrical power from the utility. Typically, each load includes its own electricity meter to measure the amount of electricity consumed at the customer site, which are referred to as a load meter.

When a new load is added to a line downstream from a transformer, the load is connected to one of three phases in a conventional manner. During initial configuration of the various loads served by a transformer, the utility attempts to balance the load across each of the three phases. However, the actual load on each of the three phases may nevertheless become unbalanced as additional loads are added to the supply lines served by the transformer. Since it is desirable to balance the loads on each of the three phases, some utilities employ methods and systems for determining the aggregate load on each of the three phases to ensure such balance, among other things. Exemplary systems and methods for determining the aggregate load across the three phases are provided in U.S. Pat. No. 8,570,023.

SUMMARY

One embodiment of the present disclosure generally relates to a method of determining loading on a three-phase power distribution system that provides power to a plurality of load meters each connected to one of three supply lines. Each of the supply lines carries a different one of three phases with one being a reference supply line having a known reference phase within the three phases. The method includes connecting a feeder meter to the reference line, transmitting a timing pulse, receiving the timing pulse at the feeder meter, and determining a feeder meter delay at the feeder meter, where the feeder meter delay is the delay from receiving the timing pulse until a landmark value of the power received by the feeder meter. The method further includes receiving the timing pulse at each of the plurality of load meters and determining a load meter delay for each of the plurality of load meters, where the load meter delay is the delay from receiving the timing pulse until a landmark value of the power received by the corresponding load meter in the plurality of load meters. The method includes determining a comparison of the load meter delay determined for each of the plurality of load meters to the feeder meter delay, where the feeder meter delay corresponds to the reference phase, and assigning one of the three phases to each of the plurality of load meters based upon the comparison.

Another embodiment generally relates to a system for determining loading on each phase of a three-phase power distribution system, the system including a plurality of load meters each connected to one of three supply lines to receive power from the power distribution system, where each of the supply lines carries a different one of three phases. A reference supply line within the three supply lines has a known reference phase within the three phases and a feeder meter is connected to the reference line. A wireless transmission device is positioned to generate a timing pulse received by each of the plurality of load meters and the feeder meter, where each of the plurality of load meters is operable to determine a time delay from receiving the timing pulse until a landmark value of the power received by that load meter. Each load meter further includes a transmission device to transmit the time delay corresponding to that load meter. The feeder meter determines a feeder meter delay from receiving the timing pulse until a landmark value of the power received by the feeder meter, where the feeder meter delay corresponds to the reference phase. An end server is operable to receive the time delay from each of the plurality of load meters and to assign each of the plurality of load meters to one of the three phases based upon a comparison of the time delay corresponding to that load meter and the feeder meter delay from the feeder meter.

Various other features, objects and advantages of the disclosure will be made apparent from the following description taken together with the drawings.

BRIEF DESCRIPTION OF THE DRAWINGS

The drawings illustrate the best mode presently contemplated of carrying out the disclosure. The same numbers are used throughout the drawings to reference like features and like components. In the drawings:

FIG. 9 is a graphic representation of another embodiment of the present disclosure for determining the load balance on a three-phase distribution system.

DETAILED DISCLOSURE

Figure 1:
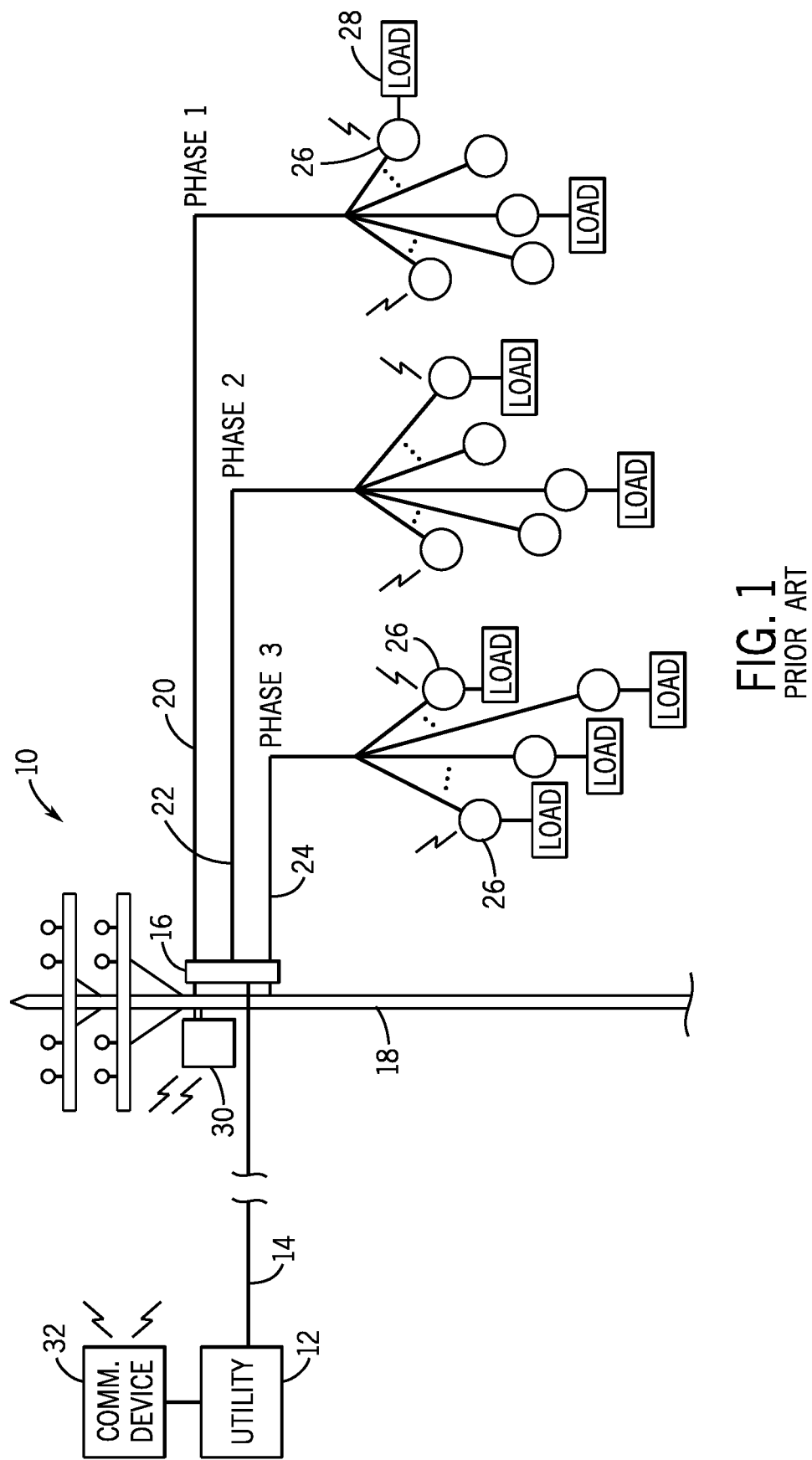
FIG. 1 is a schematic illustration of a three-phase distribution system known in the art.

This written description uses examples to disclose embodiments of the present application, including the best mode, and also to enable any person skilled in the art to practice or make and use the same. The patentable scope of the invention is defined by the claims and may include other examples that occur to those skilled in the art. Such other examples are intended to be within the scope of the claims if they have structural elements that do not differ from the literal language of the claims, or if they include equivalent structural elements with insubstantial differences from the literal language of the claims.

Systems and methods for determining for balancing electrical loads on a three-phase power distribution system are presently known. However these each require comparison of each load meter to a reference meter (also referred to as a feeder meter) that is connected to on the same supply line, as is disclosed in U.S. Pat. No. 8,570,023. Typically, a feeder meter is positioned along the supply line of each of the three phases between a transformer and each of the load meters. To determine the phase that each load meter is connected to, a timing pulse is generated from a known location. The timing pulse is received by each of the feeder meters and each of the load meters. Upon receipt of the timing pulse, each of the load meters determines a time delay from receipt of the timing pulse until a landmark value of the single phase signal received by the load meter. In certain embodiments, the landmark value of the single phase signal is a zero crossing of the single phase signal. Each feeder meter determines a feeder meter delay based on the timing pulse and landmark value in the same manner.

Each of the load meters is assigned to one of the three phases based upon the feeder meter having the feeder meter delay closest to the recorded time delay from that load meter. In certain embodiments, this assignment is based on determinations using time delay information transmitted from each feeder meter and each load meter to a tower (also referred to as a gateway). Due to the distance and topographical considerations, multiple towers are often required to provide coverage for wireless communication with every load meter supplied by the utility 12 or a substation. Accordingly, presently known systems and methods require deploying at least one feeder meter per supply line, per tower, such that each tower has an feeder meter delay available for comparison to each load meter within its range.

It should be known that in addition to detecting a feeder meter delay, certain embodiments of feeder meters known in the art are also configured to detect energy consumption for a portion of a supply line it is connected to. By serving as a reference meter for energy consumption of a given supply line, the feeder meter can then be used as a comparison to load meters at customer sites to detect theft. However, it should be recognized that a feeder meter need not perform both phase and consumption detection, which can instead be divided across multiple devices.

FIG. 1 illustrates a typical distribution system 10. In the distribution system 10 shown in FIG. 1, the utility 12 provides a supply of three-phase electricity over a series of supply lines 14. As illustrated in FIG. 1, the supply lines 14 are received by a pole mounted transformer 16. The pole mounted transformer 16 is mounted to a utility pole 18 to step down the voltage of the supply of electricity carried on the supply lines 14. The transformer 16 includes multiple connections for three separate phases of the electricity. As shown in FIG. 1, the transformer 16 provides a first phase along supply line 20, a second phase along supply line 22 and third phase along supply line 24. Each of the three phases supplied along the supply lines 20, 22 and 24 are 120° out of phase from each other, as is conventional. The three phases of the electricity are shown schematically in FIG. 3. While not shown separately, other configurations are also known, such as a split-phase three-phase supply having a total of six distinct phases.

Referring back to FIG. 1, a series of load meters 26 are each connected to one of the three phases. Each of the load meters 26 measures the amount of electricity consumed by a load 28 at a residence or small business. Each of the load meters 26 and loads 28 could represent a consumer location, for example. Only a small number of the load meters 26 and loads 28 are shown for each of the three phases of electrical power. However, it should be understood that a vast number of load meters 26 and loads 28 could be coupled to each of the three phases from the transformer 16.

As shown in FIG. 1, each of the load meters 26 includes a communication radio that allows each of the load meters 26 to communicate to a tower 30. The tower 30 is typically positioned remotely from the load meters 26 and communicates via RF signals to the load meters. The tower 30 can be located at a radio tower site and connected to an antenna to enhance the communication range. The tower 30 could alternatively be located at a utility substation. As an example, the tower 30 and load meters 26 could be part of the FlexNet communication system currently available from Sensus USA Inc.

Each of the load meters 26 and the tower 30 communicate with each other to relay energy consumption information as well as other data relevant to the operation of the load meters 26 and the tower 30. As an example, the tower 30 sends commands, requests, and timing pulses to the load meters 26. In addition to communicating to the load meters 26, the tower 30 communicates with a communication device 32 at the utility 12 to relay consumption related information to and from the tower 30. As described above, the communication between the tower 30 and the utility 12 can also utilize the FlexNet communication system. The communication between the tower 30 and a head end system/server at the utility can use many forms of PSTN, Ethernet, radio, microwave, satellite or other type of communication techniques.

The utility 12 typically includes a back end server that allows the utility to monitor the energy consumption by each of the load meters 26 connected to the electricity distribution system 10. The back end server at the utility 12 also allows the utility 12 to generate messages that are initially received by the tower 30 and communicated out to each of the individual load meters 26. As an example, the back end server at the utility 12 could relay disconnect signals, interrogation signals, or any other type of information that may be relevant to the operation of the individual load meters 26. The back end server located at the utility 12 allows the utility 12 to aggregate any combination of the individual load meters 26 and generate electricity bills for each of the end users. The communication between the utility 12 and each of the individual load meters 26 is controlled by unique addressing information assigned to each of the load meters 26.

The combined loads coupled to each of the three phases through supply lines 20, 22 and 24 are shown as being relatively balanced. This configuration is desired by the utility such that each of the three phases of the electrical power supply is not overloaded. However, as additional loads—and thus load meters 26—are added to the distribution system 10 over a period of time, the balance on each of the three phases may become disrupted such that the overall load on one phase may be significantly higher than the load on another, for instance. In the set up shown in FIG. 1, the utility 12 has no way of determining the electrical load on each of the three phases, or determining from which phase each of the plurality of load meters 26 is drawing power. Likewise, the accuracy of the distribution model (i.e., the geographical map of customer sites and the paths of supply lines providing power from the utility thereto) may decrease as the distribution system is expanded over time. In fact, the present inventors have estimated that approximately 20% of the distribution model of a typical utility is incorrect, with no practical means of detection presently known.

Figure 2:
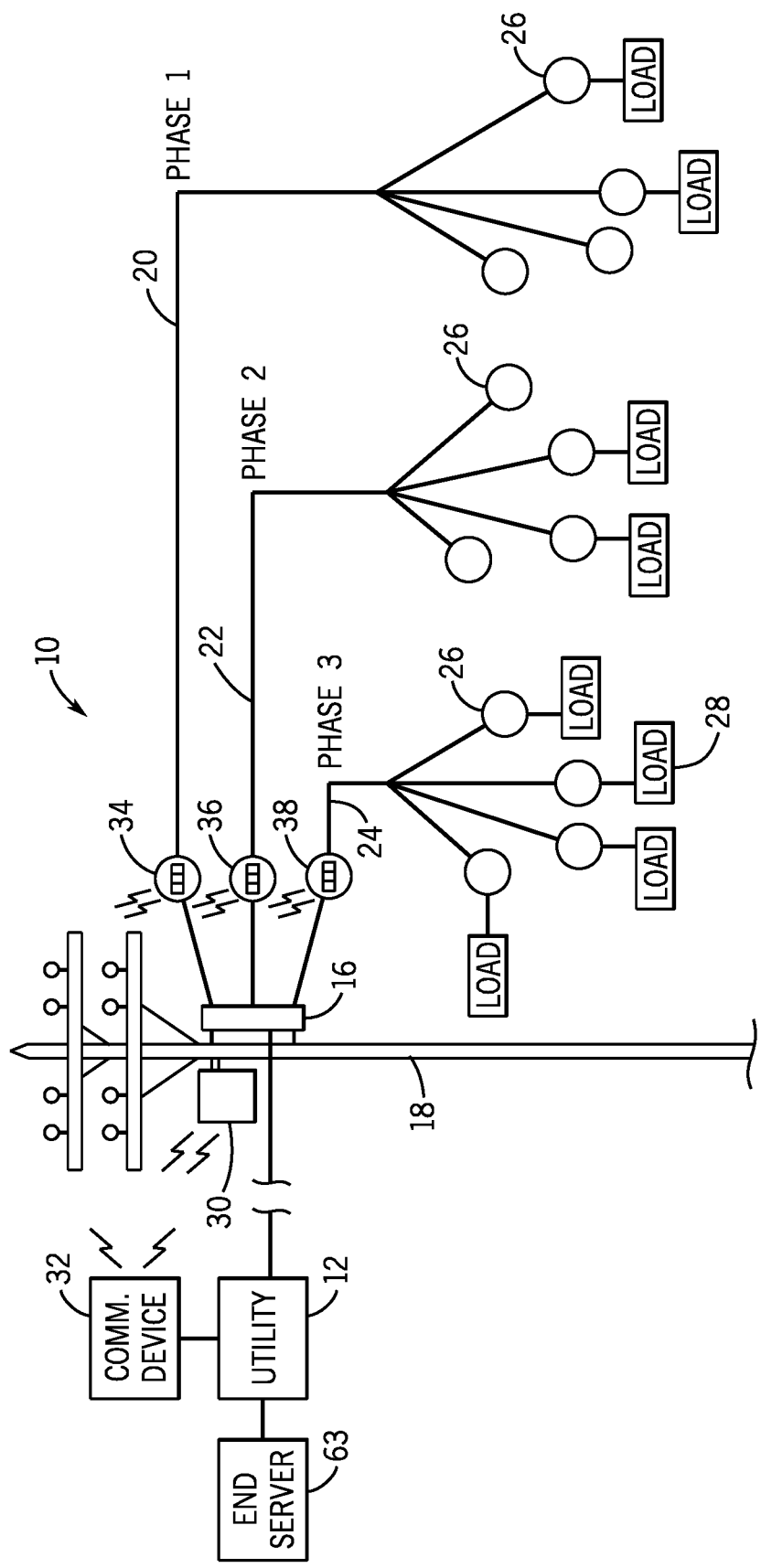
FIG. 2 is a schematic illustration of a three-phase distribution system similar to that of FIG. 1, using systems and methods known in the art to determine the load balancing.

FIG. 2 illustrates an example of a system known in the art (disclosed in U.S. Pat. No. 8,570,023) for determining the phase that each of the load meters 26 is connected to in the distribution system 10. The distribution system 10 shown in FIG. 2 is similar to the shown in FIG. 1 in that the pole mounted transformer 16 distributes the three phases of the electricity over a first phase supply line 20, a second phase supply line 22 and a third phase supply line 24. A plurality of load meters 26 are connected to each of the three supply lines 20, 22 and 24, as in the embodiment shown in FIG. 1.

However, the system shown in FIG. 2 further includes a feeder meter 34 connected to supply line 20, a feeder meter 36 connected to supply line 22 and a feeder meter 38 connected to supply line 24. Each of these feeder meters 34-36 is positioned to determine the consumption of the combined loads connected to each of the respective supply lines 20, 22 and 24 to which they are connected. The feeder meters 34, 36 and 38 include voltage sensing circuitry and may be commercially available meters, such as available from FieldMetrics, Inc. Each of the feeder meters 34-38 is equipped with a radio transmitter such that the individual feeder meters 34-38 can communicate to the tower 30.

Like the distribution system 10 shown in FIG. 1, the tower 30 communicates to a communication device 32 located at the utility 12 to receive and transmit information regarding the energy consumption of each of the individual load meters 26. In the embodiment of FIG. 2, the tower 30 also communicates to each of the feeder meters 34-38 in the same manner as the communication to each of the load meters 26.

Figure 3:
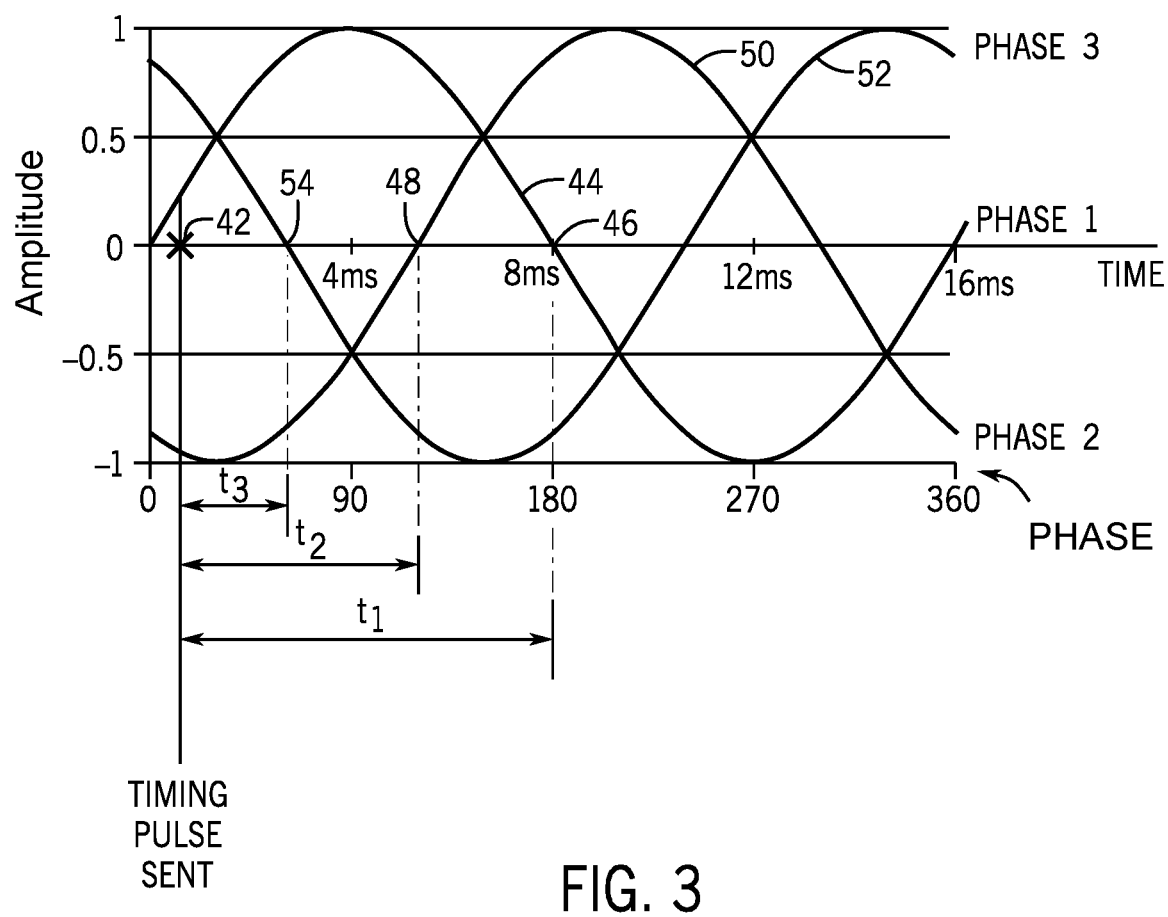
FIG. 3 is a graphic representation of the three phases of a three-phase distribution system.

The operation of this distribution system 10 will now be described with reference to FIGS. 2 and 4. As discussed previously, one ore more towers 30 are mounted in a position to together communicate with each of the load meters 26. In addition to communicating with each of the load meters 26, the towers 30 can also allow the distribution system 10 to determine the phase of each of the load meters 26. In the exemplary configuration of FIG. 2, the tower 30 operates to send a radio frequency timing pulse that is received by each of the feeder meters 34-38 and each of the load meters 26. As illustrated in FIG. 3, the timing pulse 42 can be generated at any time relative to the three phases of the electrical power supply.

Once the timing pulse has been generated, each of the feeder meters 34, 36 and 38 receives the pulse at nearly the same time relative to the other feeder meters. Upon receiving the timing pulse, the control electronics within each of the feeder meters 34-38 records the time delay from receipt of the timing pulse to the next zero crossing or other landmark feature for the electrical supply being fed through the respective feeder meter. Additional information regarding recording this time delay is provided in U.S. Pat. No. 8,570,023. In the embodiment shown in FIG. 2, the feeder meter 34 is connected to phase 1, which is shown by line 44 in FIG. 3. The time delay from the timing pulse 42 until the zero crossing 46 is represented by time delay t1. As illustrated, the time delay t1 is approximately seven milliseconds. The seven millisecond time delay t1 is recorded by the feeder meter 34 coupled to phase 1 of the power supply.

Feeder meter 36 receives the timing pulse 42 at the same time as feeder meter 34 and, since feeder meter 36 is receiving power from the second phase, the feeder meter 36 determines the time delay to the zero crossing 48 of the phase 2 voltage signal 50. In the illustration, this time delay is shown by t2 and is approximately 4.5 milliseconds.

Finally, the feeder meter 38 is connected to the phase 3 voltage signal 52 and determines the time delay from the timing pulse 42 to the zero crossing 54. This time delay is shown by reference t3 and is approximately 1.8 milliseconds, as illustrated in FIG. 3. The feeder meter 38 records the time delay t3.

As previously described, it should be understood that the time delay could be measured from the timing pulse to other landmark values of each of the three phases. As an example, the time delay could be measured from the timing pulse 42 until the positive peak of the voltage signal. Likewise, the landmark value could be the negative peak of each voltage phase. In the embodiment illustrated, the landmark value is represented by the zero crossing of each phase of the voltage signal. However, other landmark values could be utilized while operating within the scope of the present disclosure.

In addition, it should be understood that other varying values of each of the three phases could be utilized while operating within the scope of the present disclosure. As an example, instead of utilizing the voltage signal, a current or power signal could be utilized to determine the time delay from the timing pulse 42 until a landmark value of the other alternate signals. As can be understood by the disclosure, the alternate signals from each of the phases must be delayed relative to each other such that the system and method can distinguish between the various phases.

During the initial setup of the distribution system 10 shown in FIG. 2, the utility 12 is advised of the phase for each of the feeder meters 34, 36 and 38. Thus, the back end server at the utility 12 knows the phase of each of the feeder meters 34, 36 and 38.

Since the back end server at utility 12 knows the phase for each of the feeder meters 34, 36 and 38, the measured time delay from each of the feeder meters 34, 36 and 38 is designated as a feeder meter delay for the phase of that feeder meter. The feeder meter delays are stored in memory of the back end server and used in the manner to be described below.

Once each of the feeder meters 34, 36 and 38 has recorded the feeder meter delay from the timing pulse signal to the zero crossing of that phase the feeder meter is serving, the individual feeder meters 34-38 can relay the recorded delay to the tower 30. The tower 30 can then relay this recorded delay information to the utility 12 such that the back end server at the utility 12 can compare the time delay from the timing pulse to the zero crossing for each load meter connected to each phase of the three-phases to feeder meter delays from each of the feeder meters 34-38.

Referring back to FIG. 2, in addition to each of the feeder meters 34-38 recording the delay from the receipt of the timing pulse to the next zero crossing, each of the load meters 26 records the same delay. Since each of the load meters 26 is connected to one of the three phases shown in FIG. 3, each of the load meters 26 will receive the timing pulse 42 and record the delay to one of the respective three zero crossings 46, 48 and 54. Since the individual load meters 26 are located relatively close to a given tower 30, the timing pulse generated by the tower 30 will not be delayed to any of the individual load meters 26. Thus, it can be assumed that each of the load meters 26 receives the timing pulse 42 at nearly the same time relative to the other load meters 26. Further, since each of the load meters 26 receives power from the same pole mounted transformer 16, the phase of the electricity received by each of the load meters 26 will not be delayed relative to its feeder meter 34-38.

In the same manner as described with respect to the feeder meters 34-38, each of the load meters 26 records one of the time delays t1, t2, or t3, depending on the phase of power being supplied to the load meter 26. The time delay is recorded within the load meters 26 and relayed back to the tower 30. Once the delay from each of the load meters 26 is received at the tower 30, the tower 30 in turn relays this information to a back end server 63 at the utility 12. Typically, the delay for each of the load meters 26 is relayed to the utility 12 including unique identification information that identifies the load meter 26.

It should be recognized that the software may be stored, and/or processing may occur, using hardware other than the back end server G3 of the exemplary configuration previously described.

Once the utility 12 has received the time delay information from each of the feeder meters 34-38 and the plurality of load meters 26, the software operating on the back end server 63 of the utility 12 can determine the phase of each load meter 26.

In an exemplary configuration known in the art, the back end server at the utility 12 knows the phase of each of the feeder meters 34, 36 and 38 based upon the initial setup of the power distribution system. Since the phase of each of the feeder meters 34, 36 and 38 is known, the feeder meter delay recorded by the feeder meter 34 will be close to the time delay for all meters receiving power from phase 1. Likewise, the feeder meter delay from feeder meter 36 represents the time delay for all load meters receiving power from phase 2 and the feeder meter delay for feeder meter 38 represents the time delay for all of the load meters connected to phase 3. Based upon the known feeder meter delay for each of the three phases, the software on the back end server 63 on the utility 12 can then match the measured delay from each of the load meters 26 to the measured feeder meter delays from the feeder meters 34-36. In this manner, each of the load meters 26 are grouped into one of three categories. Based on the categories, the software at the utility 12 can classify each of the plurality of load meters 26 shown in FIG. 2 as being connected to a particular one of the three phases 44-48.

The present inventors have identified that in total, the number of required feeder meters can be characterized as $M = T \times C \times P$, where M is the number of feeder meters, T is the number of towers, C is the number of circuits in a tower area, and P is the number of phases per circuit. In other words, a utility servicing load meters covered by five towers across three circuits each having three phases would previously require 45 feeder meters to determine the phase of each load meter for load balancing and other tasks of interest. For simplicity, feeder meters are also referred to herein more generally as feeder meter 50.

The present inventors have further recognized that in addition to the expense of purchasing, installing, maintaining, and replacing so many feeder meters, other issues exist with presently known systems methods. These include an inability to determine phases when one or more feeder meters 50 fails to transmit (or the tower fails to receive) feeder meter delay information.

Figure 5:
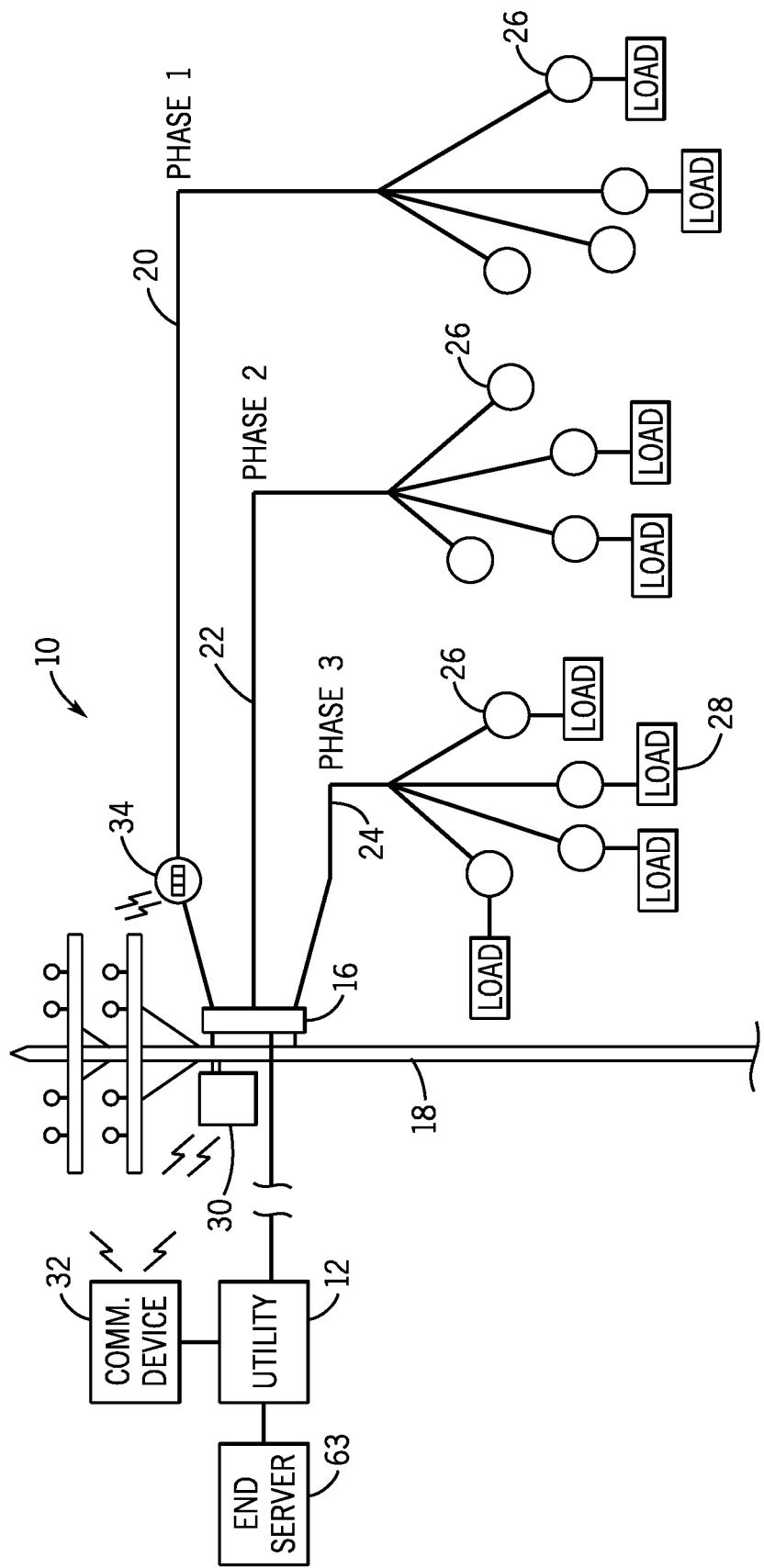
FIG. 5 is a schematic illustration of a three-phase distribution system similar to that of FIG. 2, but using one embodiment of the present disclosure to determine load balancing.
Figure 6:
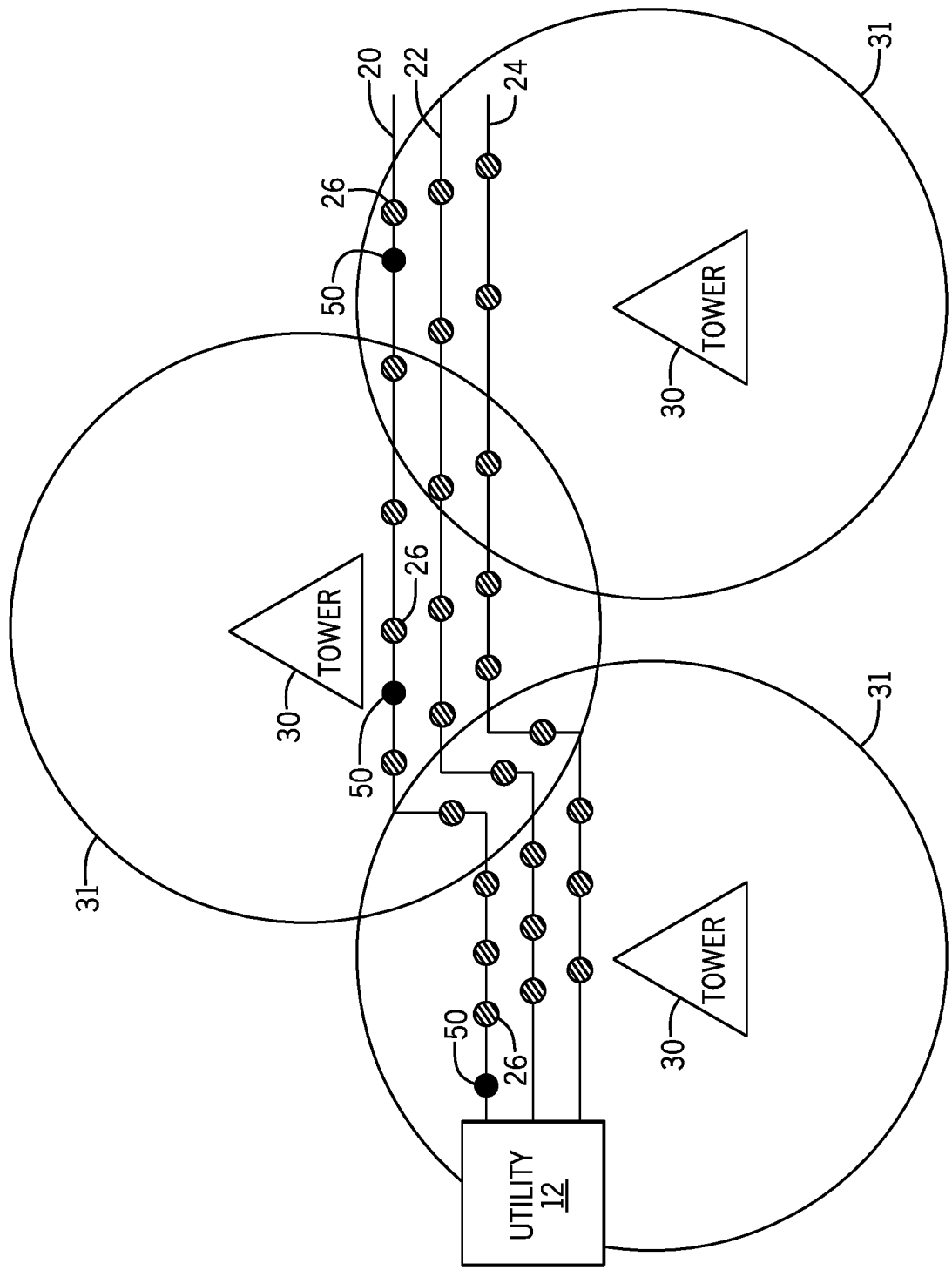
FIG. 6 is a graphic representation of one embodiment of the present disclosure for determining the load balance on a three-phase distribution system across multiple towers similar to that shown in FIG. 4.
Figure 7:
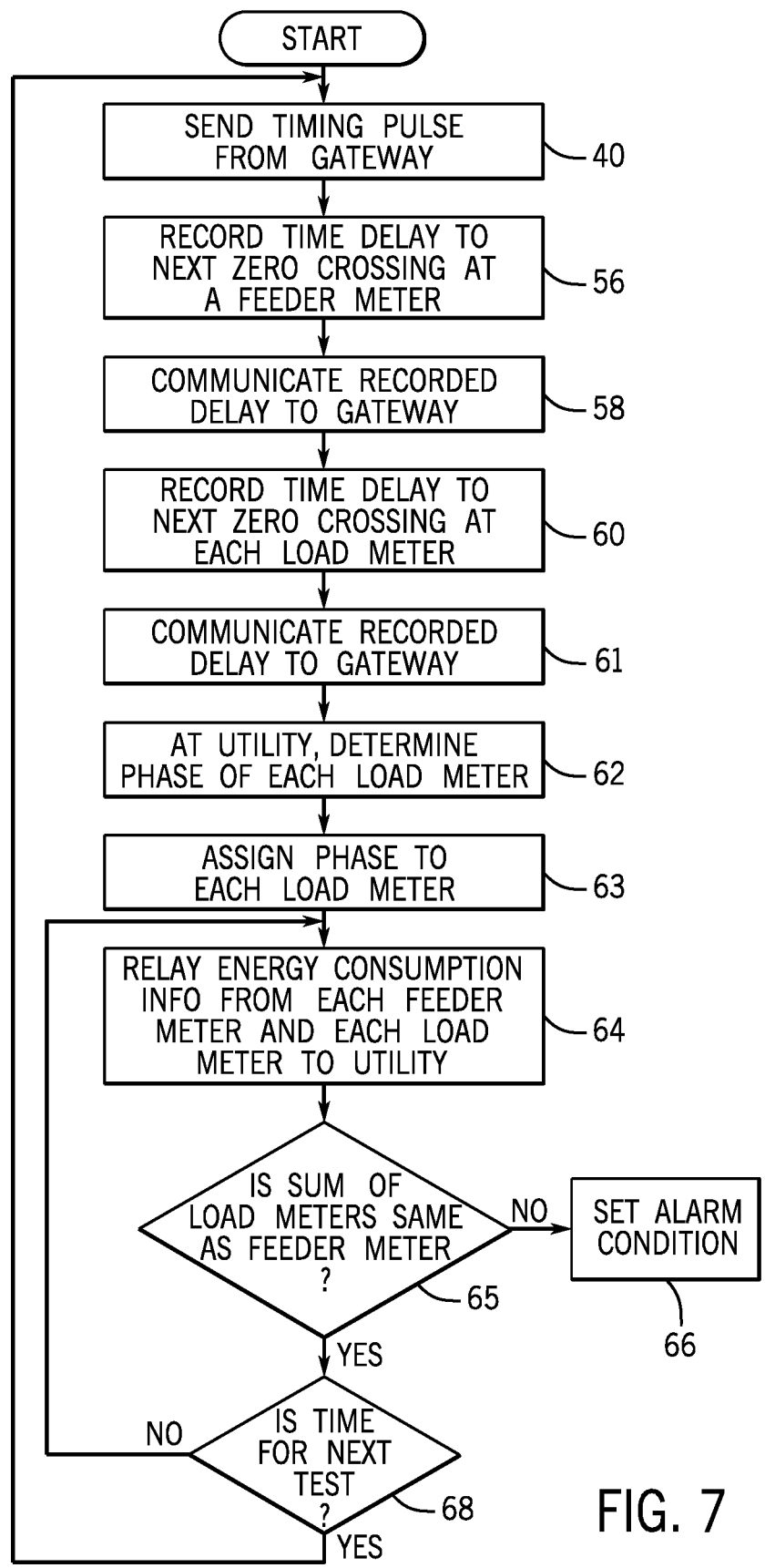
FIG. 7 is a flowchart illustrating one embodiment of the present disclosure.

Accordingly, the present inventors have developed the presently disclosed systems and methods to reduce the number of feeder meters 50 required to classify each of the plurality of load meters 26. A first embodiment is shown in FIGS. 5 and 6, and FIG. 7 generally depicts the process, to assign phases for each of the load meters 26 using as few as one feeder meter 50 per tower 30. As previously described, reducing any quantity of feeder meters 50 is advantageous with regard to upfront costs, installation costs, maintenance costs, and replacement costs. Furthermore the savings is amplified by reducing this need for every tower 30 in the distribution system 10. Thus, a reduction from three feeder meters 50 to one feeder meter 50 in a distribution system 10 having three circuits of three phases communicating through five towers 30, this is a reduction from 45 feeder meters to 15 feeder meters (5*3*3 to 5*3*1). This reduction can be seen by comparing the prior art of FIG. 4 to the present systems and methods of FIG. 5 (each showing a single circuit having three phases and three towers). Other embodiments of the present disclosure allow this to be reduced further down to a single meter per circuit regardless of the number of towers 30 (i.e., 1×3×1), as discussed further below.

As previously explained, there is no appreciable delay between receiving the timing pulse by feeder meters and load meters 26 within a tower 30 other than due to the difference in phase. Therefore, as shown in FIG. 6, for load meters 26 within the range 31 of a particular tower 30, the phase of every load meter 26 can be determined by comparison to a single feeder meter 50 within that same range 31. It should be noted that a three-phase configuration such as that shown could also be reduced from three feeder meters 50 down to two feeder meters 50, rather than down to one feeder meter 50.

Figure 4:
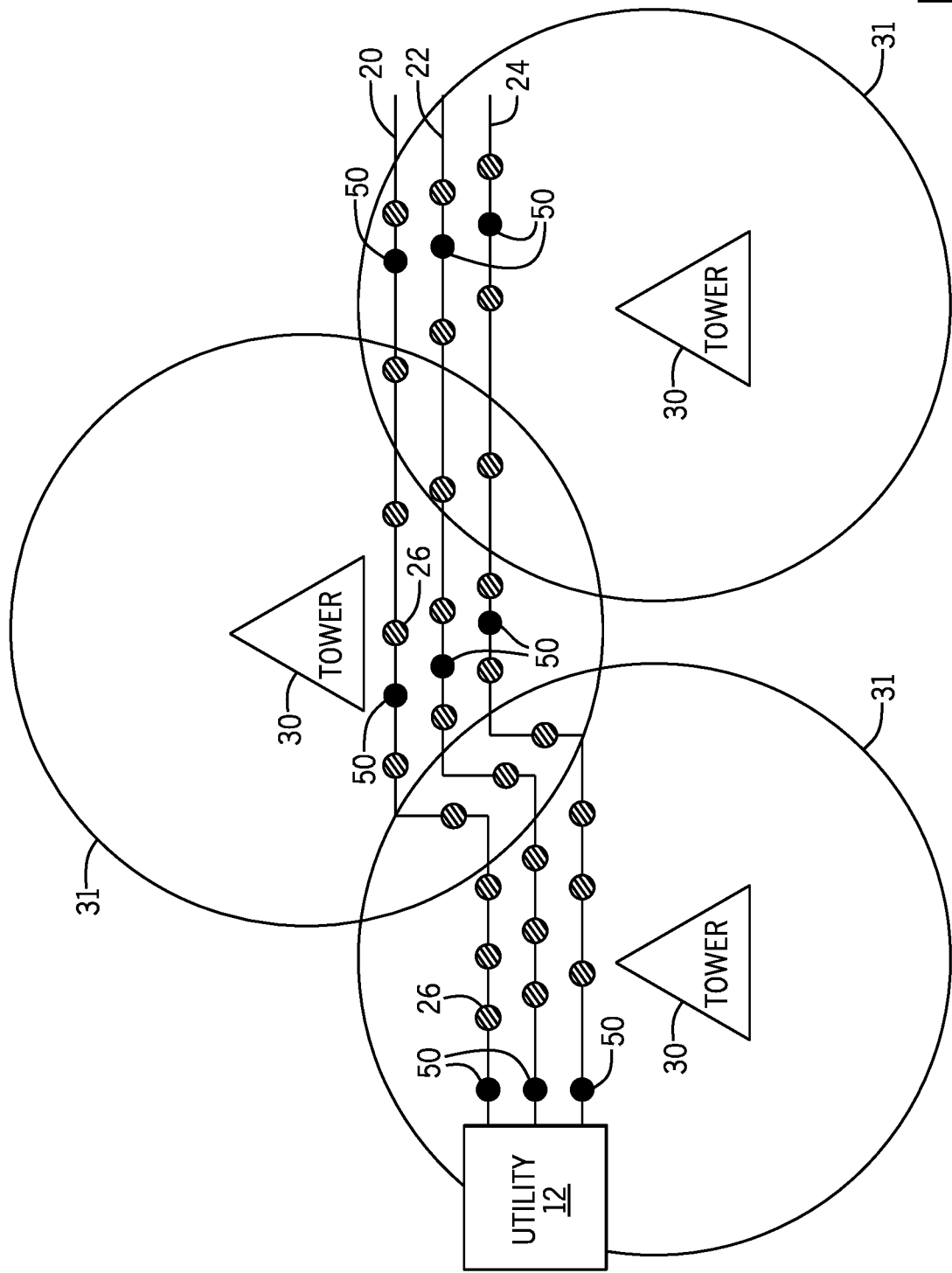
FIG. 4 is a graphic representation of systems and methods known in the art for determining the load balance on a three-phase distribution system across multiple towers.

Comparing to FIG. 4, it can be seen that the embodiment presently disclosed in FIG. 6 includes one feeder meter 50 per tower 30. Each load meter 26 in communication with the same tower 30 as a given feeder meter 50 is then assigned a phase based on comparison to the feeder meter delay for that feeder meter 50. In one embodiment, some load meters 26 overlap in the ranges 31 of multiple towers 30. In this case, one tower 30 may be preconfigured to preferentially assign the phase to such load meters 26. As previously described, such configurations, as well as the determination of phase for each load meter 26 using a single feeder meter 50, may be handled by software operating on the back end server 63 of the utility 12.

The reduction of feeder meters 50 in embodiment shown in FIG. 6 is based upon the fact that in a three-phase system, each phase is 120° out of phase with the other phases. Therefore, if a given phase designated as the reference phase is known, the other two phases will have feeder meter delays corresponding to ⅓ and ⅔ of the corresponding cycle time difference relative to the feeder meter delay of a reference meter connected to the reference phase. For example, electricity supplied at a frequency of 60 hertz has a time of 16.6667 milliseconds per cycle. When this is supplied across three phases as shown in FIG. 3, the zero crossings for the three phases after receiving a timing pulse occur between 0 to 1.85 millisecond, between 1.9 to 3.7 milliseconds, and between 3.8 milliseconds to 5.5556 milliseconds, respectively. Therefore, by designing a known phase as a reference phase and connecting a feeder meter 50 thereto, the other two phases can be determined by comparing the respective zero crossings. As previously stated, additional information regarding the identification of zero crossings and other landmark features for individual phases is provided in U.S. Pat. No. 8,570,023.

Figure 8:
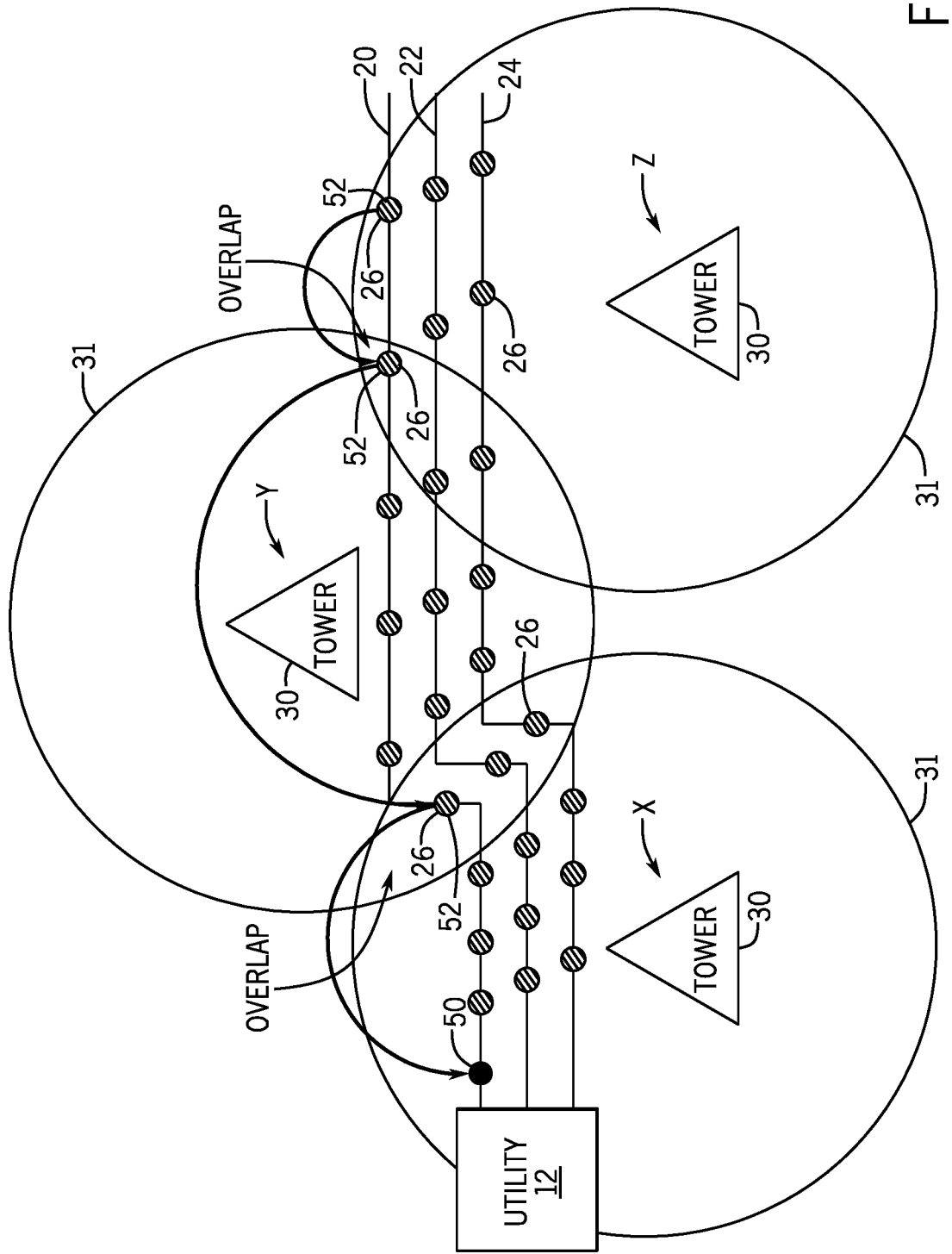
FIG. 8 is a graphic representation of another embodiment of the present disclosure for determining the load balance on a three-phase distribution system.

Another embodiment builds upon the previously described systems and methods to further reduce the number of feeder meters 50 required across multiple towers 30. Specifically, FIG. 8 shows an embodiment where a single feeder meter 50 is used to determine the phases of load meters 26 across three towers 30. It should be recognized while one feeder meter 50 is shown to support load determinations across three towers 30, this presently disclosed systems and methods are expandable to any number of towers.

This reduction down to a single feeder meter 50 as shown in FIG. 8 is attained by using information from load meters 26 that overlapping ranges 31 of multiple towers 30 to share or expand upon information across corresponding towers 30. In the example shown, the phases of every load meter 26 within the range 31 of the tower X can be determined by comparison to the feeder meter delay for the feeder meter 50 as described above. However, some of these load meters 26 within the range 31 of tower X also overlap with the range 31 of tower Y. Accordingly, a load meter 26 that overlaps between tower X and tower Y, which was assigned a phase from tower X, can be used for comparison to determine the phases of other, unassigned load meters 26 within the range 31 of the tower Y. In other words, once a load meter 26 that overlaps ranges 31 has been assigned a phase from tower X, it can be used as a surrogate feeder meter 52 for tower Y instead of installing and using another feeder meter 50 within range 31 of tower Y. After assigning phases to load meters 26 within the range 31 of tower Y, a load meter 26 also overlapping with the range 31 of tower Z can once again be designated as a surrogate feeder meter 52 for tower Z, and so on.

Through this process, it is possible to determine the phases of an unlimited number of load meters 26 across an unlimited number of towers 30 using only a single feeder meter 50 (per circuit), through assignment of surrogate feeder meters 52 in overlapping portions of ranges 31. It should be recognized that a surrogate feeder meter 52 need not be on the same supply line or phase as another surrogate feeder meter 52, or the feeder meter 50, as long as the phase of the surrogate feeder meter 52 has been determined. Likewise, assignment as a surrogate feeder meter 52 need not be static, and/or multiple surrogate feeder meters 52 may be assigned within an overlapping portion of ranges 31.

This flexibility further lends itself to another embodiment of the present disclosure, which allows assignment of phases when a feeder meters 50 or a surrogate feeder meters 52 fails to respond to a tower 30 with the necessary information. As described above and further detailed in U.S. Pat. No. 8,570,023, each tower 30 periodically pings the feeder meters 50 and load meters 26 within its range 31 to communicate respective feeder meter delays, time delays, and energy consumption information. While previously-described embodiments detail systems and methods for determining and assigning phases to load meters 26 without each tower 30 having a feeder meter 50 within its range 31. However, information from one of a feeder meter 50 or a surrogate feeder meter 52 is required for comparison to load meters 26 for a given tower 30. The present inventors have developed a further embodiment to provide this necessary information even when a feeder meter 50 or surrogate feeder meter 52 fails to respond to a tower 30 pinging.

FIG. 9 shows an example of the responsiveness for a feeder meter 50 and load meters 26 over three instances of pinging by a tower 30 (not shown). At Time 1, the feeder meter 50 has responded to the ping, as well as several load meters 26, whereby a response is designated by a solid or hashed circle. In contrast, a number of other load meters have not responded, as indicated by phantom circles. By comparing the time delays of the load meters 26 to the feeder meter delay from the feeder meter 50, the phases of all responding load meters 26 can be determined at Time 1 using the process described above.

However, when the tower 30 pings the distribution system 10 at Time 2, the feeder meter 50 from Time 1 has failed to respond (its former position now shown as a phantom circle). As such, load meters 26 that have responded at Time 2 cannot be assigned a phase by comparison to a feeder meter 50. Instead, by a load meter 26 that was previously assigned a phase is assigned as a surrogate feeder meter 52.

The surrogate feeder meter 52 is then used for assigning phases to other load meters 26 at Time 2 in place of the non-responsive feeder meter 50. The same process can be used to assign phases at Time 3, despite the act that neither the feeder meter 50 nor the original surrogate feeder meter 52 (from Time 2) have responded to the ping from the tower 30.

A load meter 26 may be identified as being suitable surrogate feeder meter 52 either before or after a feeder meter 50 fails to respond, and also need not be on the same supply line. Furthermore, multiple surrogate feeder meters 50 may be assigned and such assignments need not be static. The present inventors have identified that in certain cases it is advantageous to alternate which load meter 26 acts as a surrogate meter 52 since its phase is not known with certainty, but inferred from prior phase assignment. In other words, because a load meter 26 can be relocated among the supply lines 20-24, it is beneficial to periodically reassign or confirm the phase of each load meter 26 rather than keeping it static as a permanent surrogate feeder meter 52. For the same reason, it may be beneficial to assign multiple surrogate feeder meters 52 for verification purposes.

Once the back end server 63 at the utility 12 has determined the phase for each of the plurality of load meters 26, the utility 12 can aggregate the total consumption for the load meters 26 on each of the three phases for balancing, theft detection, and other uses detailed in U.S. Pat. No. 8,570,023. It should be understood that various other methods and systems for receiving the test pulse and determining the phase of a meter can be carried out while operating within the scope of the present disclosure.

In addition to detecting the phases of the plurality of load meters 26 for load balancing purposes, certain embodiments of the presently disclosed systems and methods are also configured to detect discrepancies between a presumed distribution model and its true configuration. As described above, approximately 20% of a typical distribution model is incorrect, which is undetectable by systems and devices presently known in the art. Among other differences, while systems known in the art are generally capable of balancing loads across all phases, these systems are incapable of confirming that the phases of the distribution model are correct. By detecting the phase of each supply line throughout the distribution system, the presently disclosed systems and methods allow the utility to confirm the accuracy of these phases within its distribution model.

In the above description, certain terms have been used for brevity, clarity, and understanding. No unnecessary limitations are to be inferred therefrom beyond the requirement of the prior art because such terms are used for descriptive purposes and are intended to be broadly construed. The different assemblies described herein may be used alone or in combination with other devices. It is to be expected that various equivalents, alternatives and modifications are possible within the scope of any appended claims.

I claim:

1. A method of determining loading on a three-phase power distribution system of three supply lines that provides power to load meters, wherein each the three supply lines has one or more of the load meters connected thereto, wherein each of the three supply lines carries a different one of three phases, wherein one of the three supply lines is designated as a reference supply line and the one of the three phases that the reference line carries is known and designated as a reference phase within the three phases, the method comprising:

connecting a feeder meter to the reference supply line;
transmitting a timing pulse;
receiving the timing pulse at the feeder meter connected to the reference supply line;
determining a time delay feeder meter at the feeder meter connected to the reference supply line, the time delay feeder meter being the delay from receiving the timing pulse at the feeder meter connected to the reference supply line until a landmark value of the power received by the feeder meter connected to the reference supply line;
receiving the timing pulse at each of the load meters;
determining, for each of the load meters, a time delay load meter that is the delay from receiving the timing pulse at that load meter among the load meters until a landmark value of the power received by that load meter among the load meters, wherein the time delay load meter is determined for a given load meter among the load meters that is connected to one of the three supply lines other than the reference supply line; and
determining which of the three supply lines the given load meter is connected to by comparing the time delay load meter determined for the given load meter to the time delay feeder meter for the feeder meter connected to the reference supply line.

2. The method according to claim 1, wherein the three phases are further divided into six split-phases.

3. The method according to claim 1, wherein the landmark value is identified immediately following receiving the timing pulse.

4. The method according to claim 1, wherein the landmark value is a zero crossing of the power provided.

5. The method according to claim 1, further comprising transmitting energy consumption data from each of the load meters to an end server, and aggregating the energy consumption data for the load meters for each of the three phases based upon which of the three supply lines each of the load meters is identified as being connected to.

6. The method according to claim 1, further comprising generating an alarm condition when an aggregated energy consumption on each of the three phases is unbalanced.

7. The method according to claim 1, wherein the feeder meter is a first feeder meter, further comprising a second feeder meters connected to one of the three supply lines, wherein a first tower is in communication with the first feeder meter and in communication with a first group of load meters among the load meters, wherein a second tower is in communication with the second feeder meter and in communication with a second group of load meters among the load meters, wherein determining which of the three supply lines each load meter within the first group of load meters is connected to includes comparing corresponding time delay load meters for each of the load meters within the first group of load meters to the first feeder meter, and wherein determining which of the three supply lines each load meter within the second group of load meters is connected to includes comparing corresponding time delay load meters for each of the load meters within the second group of load meters to the second feeder meter.

8. The method according to claim 7, wherein among the first tower and the second tower the first feeder meter communicates with only the first tower.

9. The method according to claim 7, wherein an overlap subset of the load meters in the load meters is in communication with both the first tower and the second tower, and wherein each load meter in the overlap subset of load meters is assigned to be within one of the first group of load meters and the second group of load meters.

10. The method according to claim 9, wherein an overlap load meter within the overlap subset of the load meters is assigned to be within the first group, further comprising which of the three supply lines the overlap load meter is connected to, and further comprising substituting the time delay load meter determined for the overlap meter as the time delay feeder meter for determining which of the three supply lines each of the load meters in the second group of load meters within the load meters is connected to.

11. The method according to method 9, wherein an overlap load meter within the overlap subset of the load meters is connected to the reference supply line.

12. The method according to method 9, wherein the second feeder meter is connected to the reference supply line.

13. The method according to claim 1, further comprising multiple towers each periodically pinging the feeder meter connected to the reference supply line and pinging the load meters to determine which of the three supply lines each of the load meters has been determined to be connected to, further comprising determining after a first ping a particular time delay load meter corresponding to a particular load meter among the load meters and determining that the particular load meter is connected to the reference supply line, and after a second ping substituting the particular time delay load meter determined after the first ping as the time delay feeder meter for determining which of the three supply lines remaining load meters within the load meters are connected to.

14. The method according to claim 13, further comprising determining when the feeder meter does not communicate after being pinged, and further comprising substituting, when the feeder meter is determined to not have communicated after being pinged, the particular time delay load meter corresponding to the particular load meter as the time delay feeder meter for the feeder meter.

15. A system for determining loading on each phase of a three-phase power distribution system of three supply lines, comprising:
load meters each connected to one of three supply lines to receive power from the power distribution system, wherein each of the three supply lines has one or more of the load meters connected thereto, wherein each of the three supply lines carries a different one of the three phases, and wherein one of the three supply lines is designated as a reference supply line and the one of the three phases carried by the reference supply line is known and designated as a reference phase within the three phases;
a feeder meter connected to the reference supply line;
a wireless transmission device configured to generate a timing pulse receivable by each of the load meters and by the feeder meter, wherein each of the load meters is operable to determine a time delay from receiving the timing pulse at that load meter until a landmark value of the power received by that load meter, each load meter further including a transmission device to transmit the time delay corresponding thereto, wherein the feeder meter connected to the reference supply line determines a time delay feeder meter from receiving the timing pulse at the feeder meter connected to the reference supply line until a landmark value of the power received by the feeder meter connected to the reference supply line; and
an end server operable to receive the time delay from each of the load meters and to identify which of the three supply lines each of the load meters is connected to by comparing the time delay corresponding to that load meter among the load meters and the time delay feeder meter from the feeder meter connected to the reference supply line, wherein the time delay load meter is determined for a given load meter among the load meters that is connected to one of the three supply lines other than the reference supply line.

16. The system according to claim 15, wherein time delay load meters are determined for all of the load meters based on comparisons to the time delay feeder meter determined for the feeder meter connected to the reference supply line.

17. The system according to claim 15, wherein the wireless transmission device is further configured to transmit energy consumption data from each of the load meters to the end server, and wherein the end server is further operable to aggregate the energy consumption data for the load meters for each of the three phases based upon which of the three supply lines each of the load meters is identified as being connected to.

18. The system according to claim 15, wherein the feeder meter is a first feeder meter, further comprising a second feeder meter connected to one of the three supply lines, wherein the wireless transmission device is a first wireless transmission device, further comprising a second wireless transmission device, wherein the first transmission device is in communication with the first feeder meter and a first group of load meters among the load meters, wherein the second wireless transmission device is in communication with the second feeder meter and also with a second group of load meters among the load meters, wherein determining which of the three supply lines each load meter in the first group of load meters is connected to includes comparing corresponding time delay load meters for each of the load meters within the first group of load meters to the first feeder meter, and wherein determining which of the three supply lines each load meter in the second group of load meters is connected to includes comparing corresponding time delay load meters for each of the load meters within the second group of load meters to the second feeder meter.

19. The system according to claim 15, wherein the wireless transmission device is a first wireless transmission device, further comprising a second wireless transmission device, wherein the first wireless transmission device and the second wireless transmission devices each periodically pinging the feeder meter connected to the reference supply line and periodically pinging the load meters to determine which of the three supply lines each of the load meters is connected to, wherein after a first ping a particular wireless transmission device among the first wireless transmission device and the second wireless transmission device determines a particular time delay load meter corresponding to a particular load meter within the load meters, and wherein after a second ping the particular time delay load meter is substituted as the time delay feeder meter for determining which of the three supply lines remaining load meters within the load meters are connected to when the particular load meter is determined to be connected to the reference supply line.

* * * * *